(12) United States Patent
Derai et al.

(10) Patent No.: US 11,521,861 B2
(45) Date of Patent: Dec. 6, 2022

(54) METHOD OF MANUFACTURING SEMICONDUCTOR DEVICES AND CORRESPONDING SEMICONDUCTOR DEVICE

(71) Applicant: STMicroelectronics S.r.l., Agrate Brianza (IT)

(72) Inventors: Michele Derai, Milan (IT); Giovanni Graziosi, Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 102 days.

(21) Appl. No.: 16/994,049

(22) Filed: Aug. 14, 2020

(65) Prior Publication Data

US 2021/0050226 A1 Feb. 18, 2021

(30) Foreign Application Priority Data

Aug. 16, 2019 (IT) .................. 102019000014832

(51) Int. Cl.
*H01L 21/48* (2006.01)
*H01L 21/56* (2006.01)
(Continued)

(52) U.S. Cl.
CPC ........ *H01L 21/4825* (2013.01); *H01L 21/561* (2013.01); *H01L 21/565* (2013.01);
(Continued)

(58) Field of Classification Search
CPC . H01L 21/4825; H01L 21/561; H01L 21/565; H01L 21/78; H01L 23/3114;
(Continued)

(56) References Cited

U.S. PATENT DOCUMENTS 9,330,994 B2 5/2016 Camacho et al.
2015/0279778 A1 10/2015 Camacho et al.
(Continued)

FOREIGN PATENT DOCUMENTS

DE 102011007537 A1 10/2012
WO 03015165 A2 2/2003

OTHER PUBLICATIONS

IT Search Report and Written Opinion for IT Appl. No. 102019000014832 dated Feb. 27, 2020 (9 pages).

(Continued)

*Primary Examiner* — Vu A Vu
(74) *Attorney, Agent, or Firm* — Crowe & Dunlevy

(57) ABSTRACT

Semiconductor dice are arranged on a substrate such as a leadframe. Each semiconductor die is provided with electrically-conductive protrusions (such as electroplated pillars or bumps) protruding from the semiconductor die opposite the substrate. Laser direct structuring material is molded onto the substrate to cover the semiconductor dice arranged thereon, with the molding operation leaving a distal end of the electrically-conductive protrusion to be optically detectable at the surface of the laser direct structuring material. Laser beam processing the laser direct structuring material is then performed with laser beam energy applied at positions of the surface of the laser direct structuring material which are located by using the electrically-conductive protrusions optically detectable at the surface of the laser direct structuring material as a spatial reference.

23 Claims, 5 Drawing Sheets

(51) Int. Cl.
*H01L 21/78* (2006.01)
*H01L 23/31* (2006.01)
*H01L 23/495* (2006.01)

(52) U.S. Cl.
CPC .......... *H01L 21/78* (2013.01); *H01L 23/3114* (2013.01); *H01L 23/4952* (2013.01); *H01L 23/49513* (2013.01)

(58) Field of Classification Search
CPC ........... H01L 23/49513; H01L 23/4952; H01L 23/3107; H01L 2223/54486; H01L 21/56; H01L 23/295; H01L 23/544; H01L 24/24; H01L 24/76; H01L 24/82; H01L 24/11; H01L 24/13; H01L 24/29; H01L 24/83; H01L 2223/54426; H01L 2224/05624; H01L 2224/1134; H01L 2224/11462; H01L 2224/13014; H01L 2224/13101; H01L 2224/13144; H01L 2224/13147; H01L 2224/24225; H01L 2224/24245; H01L 2224/27318; H01L 2224/2919; H01L 24/97; H01L 2224/32245; H01L 2224/73253; H01L 2224/76158; H01L 2224/76702; H01L 2224/76753; H01L 2224/82101; H01L 2224/82103; H01L 2224/8213; H01L 2224/82132; H01L 2224/82214; H01L 2224/83192; H01L 2224/8385; H01L 2224/92244; H01L 2924/15311; H01L 2924/15313; H01L 2924/15747; H01L 2924/181
USPC ........................................................ 438/112
See application file for complete search history.

(56) References Cited

U.S. PATENT DOCUMENTS

| | | | |
|---|---|---|---|
| 2016/0071788 A1* | 3/2016 | Lohia | H01L 21/561 257/676 |
| 2016/0300779 A1 | 10/2016 | Watanabe et al. | |
| 2018/0342433 A1 | 11/2018 | Ziglioli et al. | |
| 2018/0342434 A1 | 11/2018 | Ziglioli | |
| 2018/0366407 A1 | 12/2018 | Ooi et al. | |
| 2019/0115287 A1 | 4/2019 | Derai et al. | |
| 2020/0381380 A1* | 12/2020 | Lee | H01L 24/13 |

OTHER PUBLICATIONS

Fechtelpeter et al., "Reliability in MID—barriers, potentials, fields of action," 2016 12th International Congress Molded Interconnect Devices (MID), 6 pages.

* cited by examiner

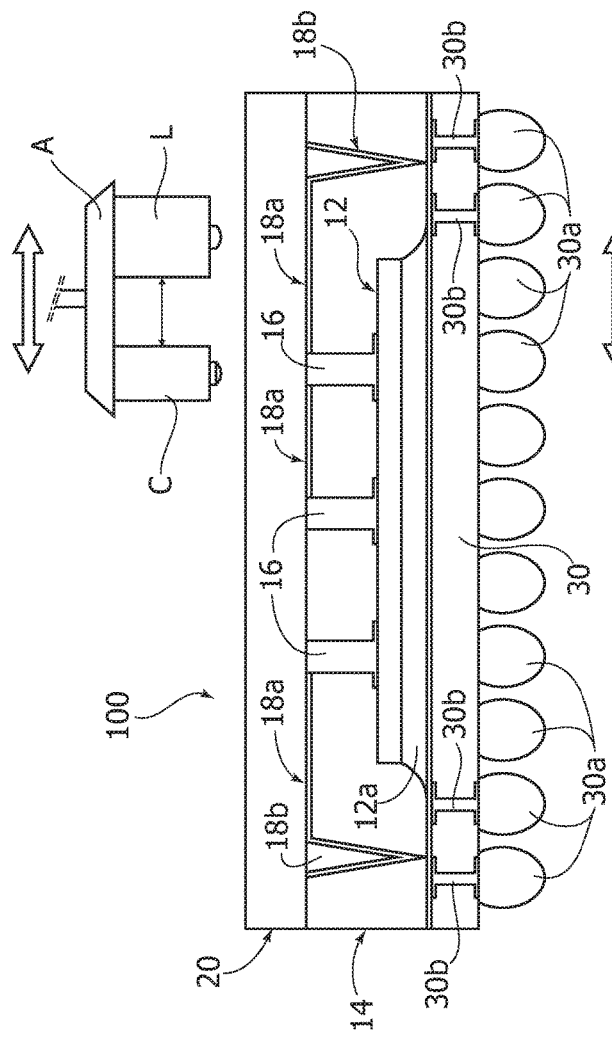
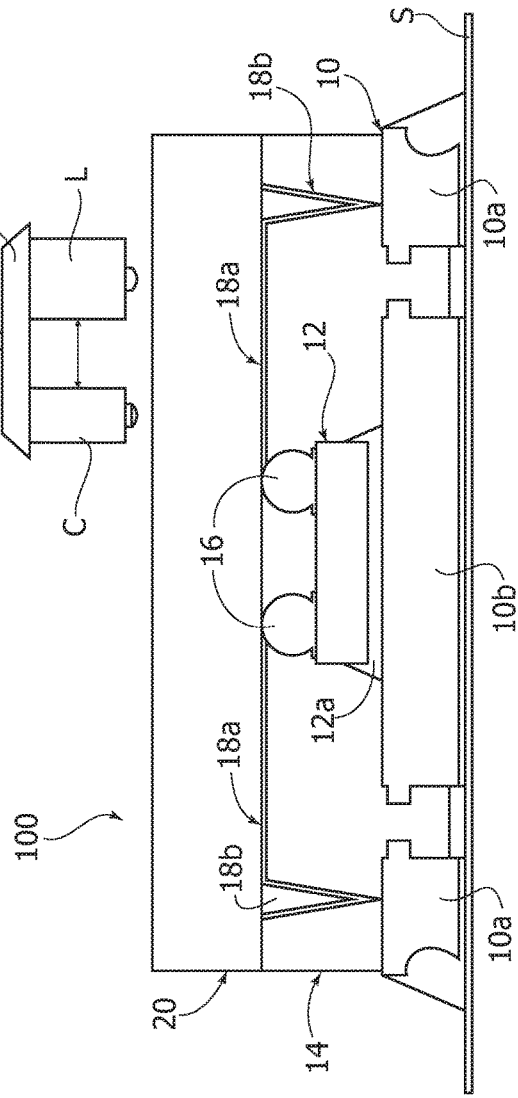
FIG. 2
FIG. 3

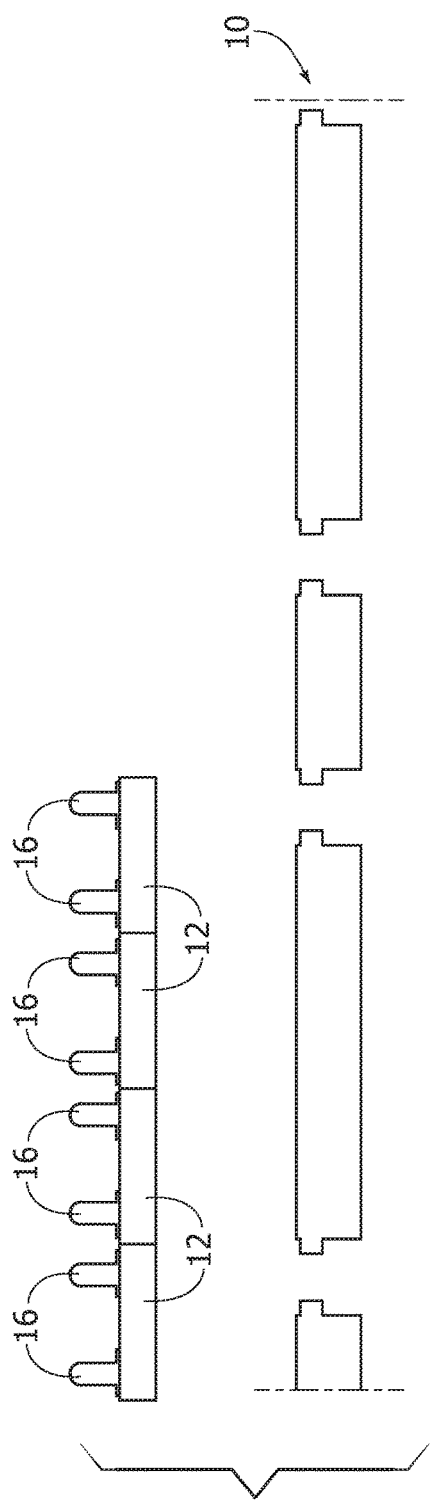
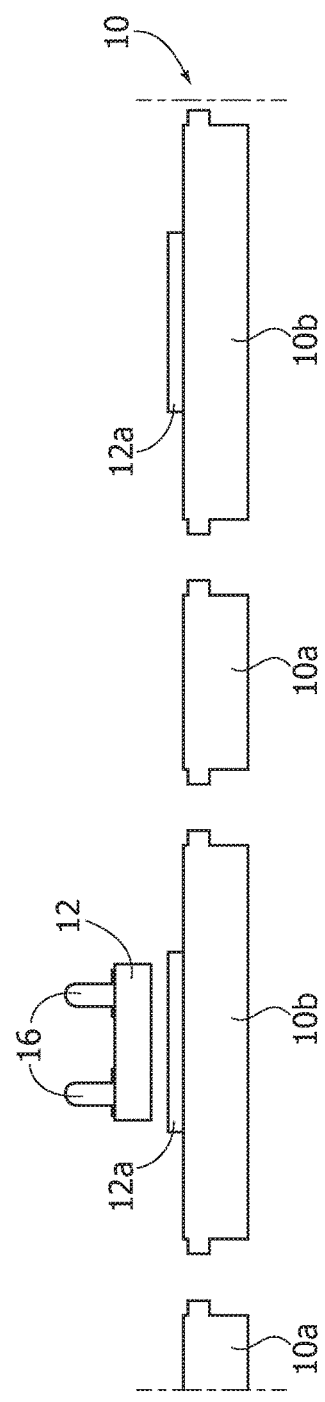
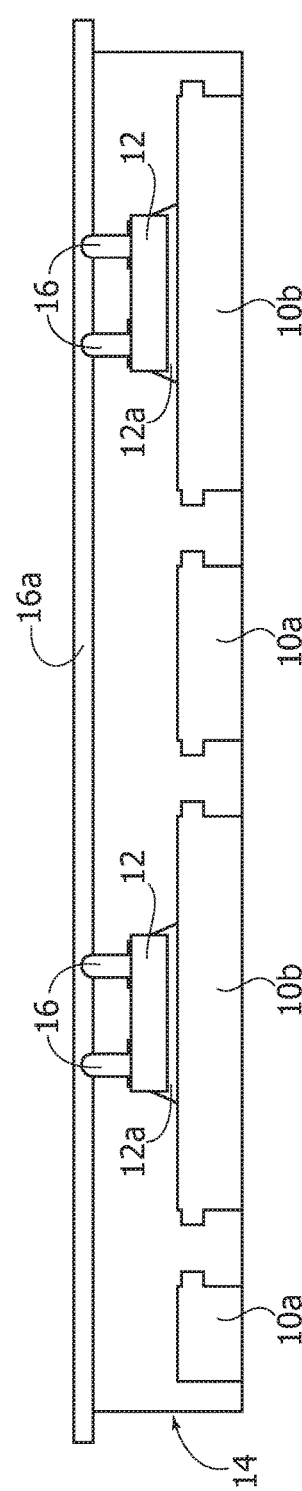
FIG. 4A
FIG. 4B
FIG. 4C

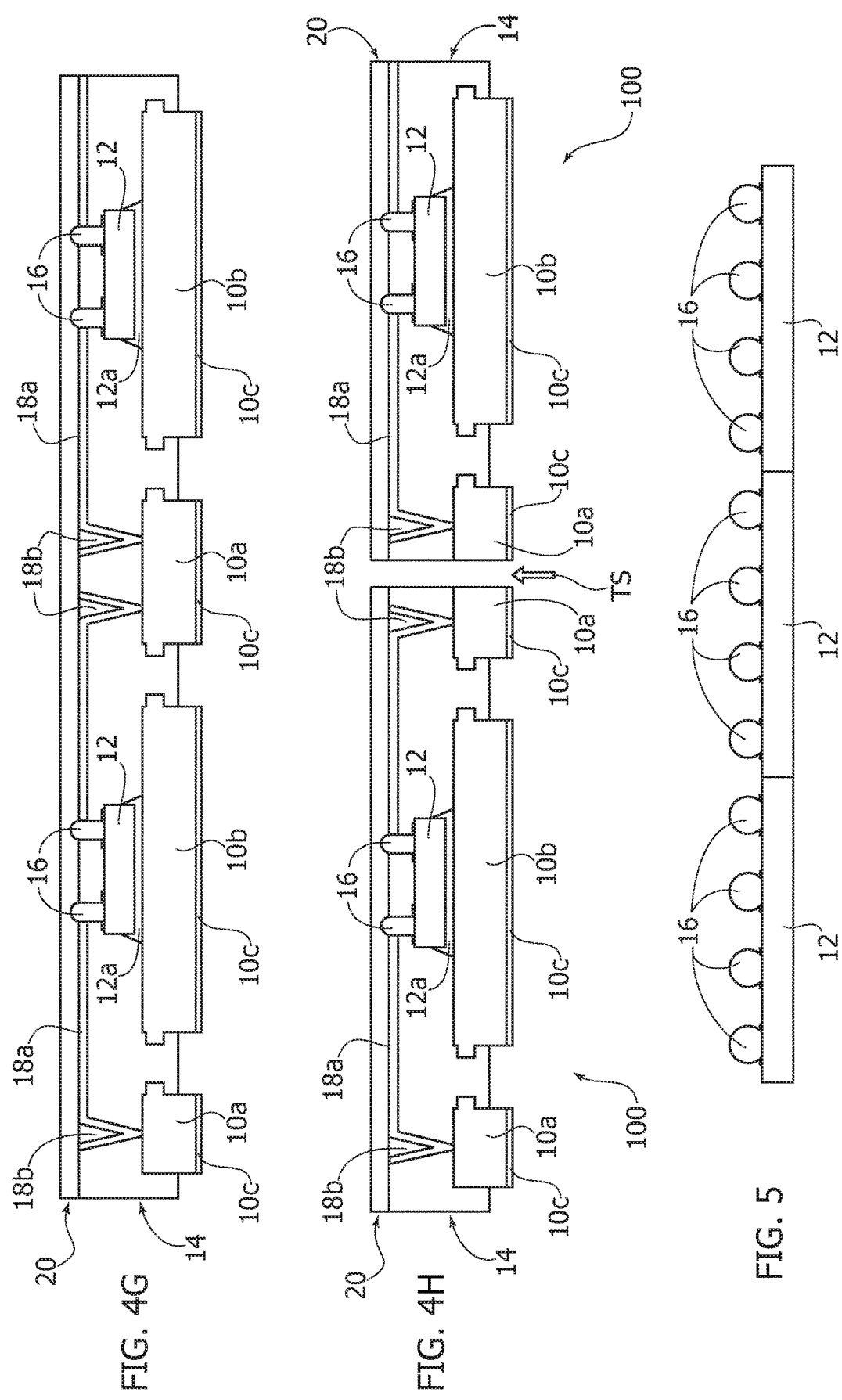

METHOD OF MANUFACTURING SEMICONDUCTOR DEVICES AND CORRESPONDING SEMICONDUCTOR DEVICE

PRIORITY CLAIM

This application claims the priority benefit of Italian Application for Patent No. 102019000014832, filed on Aug. 16, 2019, the content of which is hereby incorporated by reference in its entirety to the maximum extent allowable by law.

TECHNICAL FIELD

The description relates to manufacturing semiconductor devices.

One or more embodiments may be applied, for instance, to manufacturing semiconductor devices such as integrated circuits (ICs).

BACKGROUND

Fabricating semiconductor devices may involve, once a semiconductor chip or die (briefly, the "silicon") is assembled on a substrate such as a leadframe to form an assembly, an act of packaging, namely encapsulating the assembly in order to prevent damage or corrosion. Such a packaging operation may comprise molding onto the assembly a package molding compound such as an epoxy molding compound (EMC), for instance.

Laser Direct Structuring (LDS) is a laser-based machining technique now widely used in various sectors of the industrial and consumer electronics markets, for instance for high-performance antenna integration, where an antenna design can be directly formed onto a molded plastic part. In an exemplary process, the molded parts can be produced with commercially available resins which include additives suitable for the LDS process. A broad range of resins such as polymer resins like PC, PC/ABS, ABS, LCP are currently available for that purpose.

In LDS, a laser beam can be used to transfer a desired electrically-conductive pattern onto a plastic molding which may then be subjected to metallization (for instance via electroless plating with copper or other metals) to finalize a desired conductive pattern.

There is a need in the art to contribute in facilitating application of laser direct structuring (LDS) technology to manufacturing semiconductor devices.

SUMMARY

One or more embodiments may rely on the provision of metal pillars—such as Cu (copper) pillars—produced via electrolytic metal growth from die pads, optionally with a round cross-section and solderable material at their tips.

In one or more embodiments, using semiconductor dice provided with such pillars facilitates driving a laser drilling action on a (first) molding compound comprising LDS material. For instance, a laser drilling head equipped with a (standard) camera is capable of recognizing such pillars (possibly along with leadframe fiducials) and adapting its "drawing" or "writing" action to real conditions.

One or more embodiments facilitate extending LDS handling to (virtually all types of) semiconductor pads compatible with the formation of pillars such as Cu pillars overcoming compatibility constraints related with Cu finishing only.

One or more embodiments facilitate avoiding laser misalignment issues and possible die damage induced by the application of undesirably high laser power.

In one or more embodiments, bumps (such as so-called stud bumps and/or solder bumps with any solder alloy) may be used in the place of pillars in order to provide electrically-conductive protrusions protruding (upwardly) for a semiconductor die with such protrusions optically detectable at the surface of laser direct structuring material in order to guide a laser drilling head in its "drawing" or "writing" action of the LDS material.

BRIEF DESCRIPTION OF THE DRAWINGS

One or more embodiments will now be described, by way of example only, with reference to the annexed figures, wherein:

FIGS. 1, 2 and 3 are cross-sectional views through semiconductor products to which embodiments may apply, FIGS. 4A to 4H are exemplary of steps of a fabrication method, and FIG. 5 is exemplary of a possible variant in embodiments.

Figure 1:
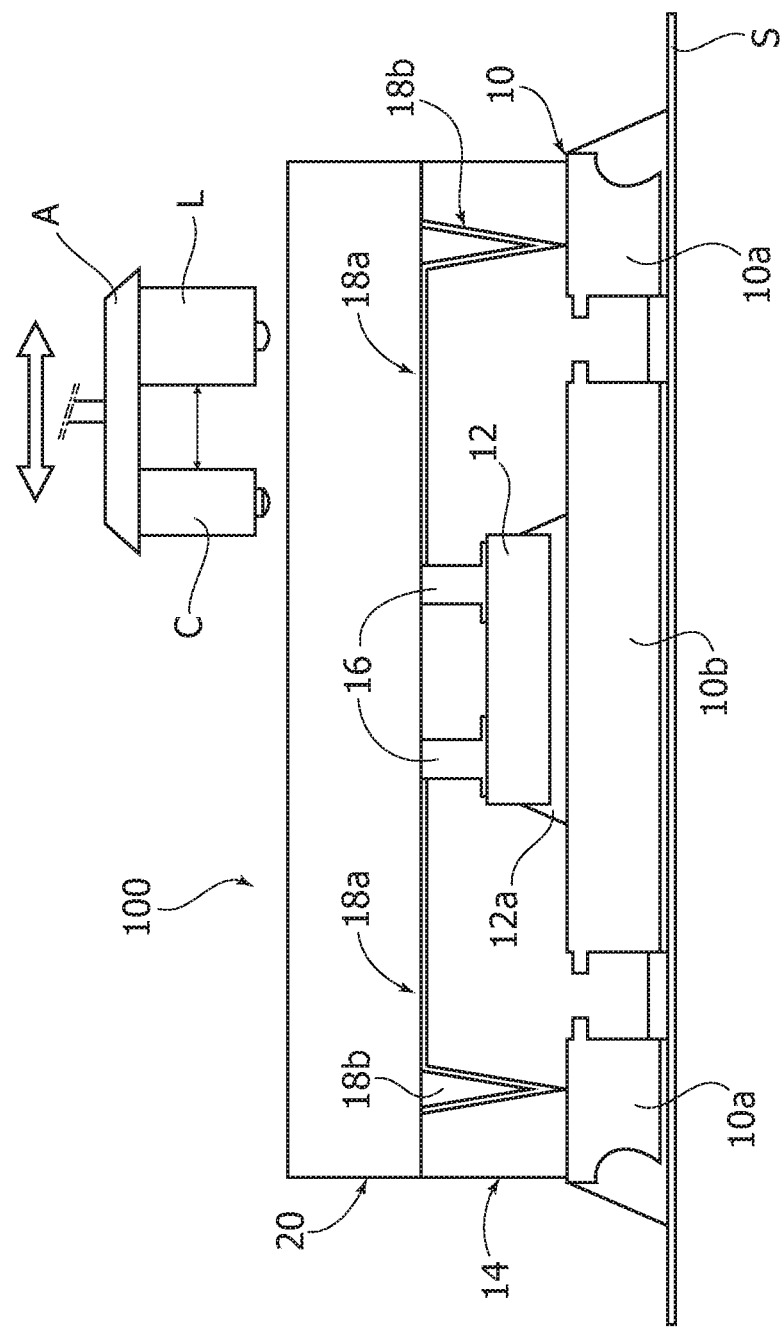

It will be appreciated that, for the sake of simplicity and ease of explanation, the various figures may not be drawn to a same scale.

DETAILED DESCRIPTION

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular conformations, structures, or characteristics may be combined in any adequate way in one or more embodiments. The references used herein are provided merely for convenience and hence do not define the extent of protection or the scope of the embodiments.

Applying LDS technology to packaging semiconductor devices facilitates creating interconnections from one or more dice to lead-frame leads or substrate terminals through vias and lines.

United States Patent Application Publication No. 2019/0115287 teaches a possible application of LDS technology which involves laser drilling and structuring a molding compound to provide therein electrically-conductive formations. A solution related to the same concept is disclosed in an Italian Patent Application No 102019000014829, filed Aug. 16, 2019. These references are incorporated herein by reference.

A technology such as LDS may facilitate effectively replacing wire bonding technology by taking advantage of a laser unit having knowledge of the actual position of a semiconductor die (chip) with the die somehow "masked" by a mold layer extending over the die. Inaccurate "blind mode" operation of the laser unit may, in fact, result in undesirable misalignment in die pads and vias drilled in the LDS material with a possible risk of die damage during laser drilling or lack of electrical continuity.

Such issues may be at least notionally addressed, for instance, by using laser units equipped with an X-ray integrated system (capable of recognizing the die position through the molding compound, which may be impermeable to visible light) or by resorting to die maps created by the die attach machine (these may facilitate the laser unit in becoming aware of the real die position), with the possibility of detecting possible die displacement with respect to a nominal expected position.

It is noted that equipping an LDS laser drilling unit with an X-ray integrated system involves merging very different technologies in one machine or unit, which may end up being very complicated and expensive.

Similar concerns may arise in connection with the possible generation of die maps (X, Y and theta positions) which involves coupling the laser drilling unit with die attach machinery in a system capable of building a die map (a leadframe map, for instance), reading that map and executing it.

Additionally, such arrangements may not completely dispense with the risk of possible die damage resulting from laser over-etching.

Also it is observed that laser processing may involve metal (Cu) finishing of semiconductor pads which would inevitably result in a restriction of the device portfolio compatible with LDS technology.

One or more embodiments may be based on the recognition that technologies such as electroplating facilitate growing electrically-conductive formations (metal "pillars" such as Cu pillars, for instance) on top of a semiconductor chip or die.

Also, compression molding facilitates covering dice on a substrate (such as a leadframe, for instance) with a thin resin layer to hold such formations during molding of an LDS compound. Most LDS resins in granular condition currently available on the market and suited to be used with a compression mold machine can be used for forming such a layer with a thickness of about 50 μm may be exemplary of such layer. In that way, the last (distal) pillar offshoot will not be covered by the LDS molding compound.

A laser unit can then be used to create electrically-conductive lines (traces) and/or vias in the LDS molding compound and connect them to the pillars so that—after possible (e.g. Cu) plating—the die or dice will be electrically coupled to the leadframe/substrate.

One or more embodiments may thus provide an easy and fast way to couple a semiconductor die or dice to leads in packages avoiding misalignment and die damage while also possibly increasing productivity (units per hour or UPH) of laser processing.

The risk of damaging semiconductor pads as a result of over-etching induced by laser beam treatment can be reduced and virtually dispensed with.

The portfolio devices compatible with the use of LDS technology along the lines discussed in the foregoing can be extended by noting that Cu pillars, for instance, are largely used on aluminum pads, for instance.

One or more embodiments facilitate extending the use of LDS technology to fine pad pitches insofar as offsets in drilling vias above the die pads can be limited and virtually avoided.

FIG. 1 is a cross-sectional view across a semiconductor product 100 to which one or more embodiments may apply.

In FIG. 1, reference S denotes a (possibly sacrificial) substrate onto which a leadframe 10 is provided.

The designation "leadframe" (or "lead frame") is currently used (see, for instance the USPC Consolidated Glossary of the United States Patent and Trademark Office) to indicate a metal frame which provides support for an integrated circuit chip or die as well as electrical leads to interconnect the integrated circuit in the die or chip to other electrical components or contacts.

Essentially, a leadframe comprises an array of electrically-conductive formations (leads) 10a which from an outline location extend inwardly in the direction of a semiconductor chip or die thus forming an array of electrically-conductive formations from a die pad 10b configured to have at least one semiconductor chip or die 12 attached thereon. This attachment may be via conventional means such as a die attach adhesive (a die attach film or DAF, for instance).

In an arrangement as exemplified in FIG. 1 (which is exemplary of a so-called Quad-Flat No-Lead or QFN package) a first mass or layer of LDS molding compound 14 is provided.

In one or more embodiments, the LDS compound layer 14 is deposited in such a way to provide a (per se electrically-insulating) encapsulation onto the semiconductor die or dice 12 possibly extending into the spaces between the leads 10a and the die pad 10b in the leadframe 10.

In one or more embodiments as exemplified herein, electrically-conductive formations 16 may be provided at the upper (front) surface of the semiconductor die or dice 12 (a single die is exemplified for simplicity) with the formations 16 having a distal (here upper) end surfacing (ticking-off) from the molding compound 14 so that these distal end or ends may be optically visible at the surface of the LDS molding compound 14.

These distal end or ends of the formation or formations 16 (even a single formation can be provided, but having plural formations 16 was found to be advantageous) can thus be located by camera C (of any standard type) which is coupled to laser apparatus L configured to form electrically conductive lines coupling the electrically-conductive formations 16 protruding from the die or dice 12 with the leads 10a in the leadframe 10.

As discussed, for instance, in United States Patent Application Publication No. 2019/0115287 or in Italian Patent Application No 102019000014829, these electrically conductive lines may comprise lines or traces 18a at the surface of the compound 14 as well as vias 18b extending through the compound 14 between opposed surfaces of the compound layer. A LDS compound 14 may comprise any of a broad range of LDS materials, for instance resins such as polymer resins like PC, PCBS, BS, LCP as currently available on the market. After molding such an LDS compound, laser structuring of electrically-conductive lines (traces) 18a and vias 18b, may be performed—possibly repeatedly—to create an (even quite complex) routing of electrically-conductive formations.

Laser processing of the LDS compound 14 may involve LDS compound activation via a laser beam as indicated at L to provide a conductive or somewhat conductive structure, with possible metallization such as plating being performed to facilitate increasing electrical conductivity as conventional in the art.

In one or more embodiments, accuracy of LDS laser beam structuring is facilitated by the laser unit L being "guided" by the camera C. The laser unit L may thus become aware of the actual position of the semiconductor die or dice 12—even though those are masked by the (light-impermeable) LDS compound 14—with displacement and operation of the laser unit L guided by the tips of the formations 16 which (in possible cooperation with leadframe fiducials, not visible in the figures) may act as reference positioning markers for the laser unit L.

As conventional in other areas (camera-guided robots, for instance) the camera C and the laser unit L can be mounted on a common carrier A controllably movable in a manner known to those of skill in the art.

In one or more embodiments, formations such as the formations 16 shown in FIG. 1 may comprise metal "pillars" (Cu pillars, for instance) adapted to be formed at the upper or top (front) surface of a die or dice 12 by conventional techniques such as electroplating.

It will be otherwise appreciated that one or more embodiments may not be limited to the use of copper (Cu) as the material for providing formations such as pillars 16.

Materials such as gold or solder bump materials comprising solder alloy can be used for that purpose.

In one or more embodiments, process steps for completing fabrication of a semiconductor product such as the semiconductor product 100 exemplified in FIG. 1 (an integrated circuit or IC, for instance) may include a further mass of package molding compound 20 molded onto the upper or front surface of the first package material 14 where lines 18a and/or vias 18b have been provided by LDS processing.

In one or more embodiments, the (further) mass of package molding compound 20 may include conventional (that is, non-LDS) molding compound such as an epoxy molding compound (EMC).

FIG. 2 is exemplary of the possibility of extending the concepts discussed previously in connection with a QFN package as exemplified in FIG. 1 to other types of packages such as Land Grid Array (LGA) or Ball Grid Array (BGA) packages.

FIG. 2 (where parts or elements like parts or elements already discussed in connection with FIG. 1 are indicated with like references symbols, so that a detailed description will not be repeated for brevity) is further exemplary of the possibility of mounting one or more semiconductor dice 12 (via adhesive 12a, for instance) onto an (organic) substrate 30 having an array of electrically-conductive "balls" 30a formed at the underside thereof, that is at the surface opposite the semiconductor die or dice 12 with electrically conductive lines 30B extending therethrough.

FIG. 3 (here again, parts or elements like parts or elements already discussed in connection with FIG. 1 or FIG. 2 are indicated with like references symbols, so that a detailed description will not be repeated for brevity) is exemplary of the possibility for the electrically-conductive formations 16 surfacing at the front upper surface of the LDS molding compound 14 to comprise bumps such as so-called stud bumps and/or solder bumps with any solder alloy.

These can be provided by any bump forming technology known to those of skill in the art such as electroplating or other known technologies adapted to provide bumps using electrically-conductive materials (for instance metals such as Cu, solder or possibly Au).

Those of skill in the art will otherwise appreciate that, while FIG. 3 exemplifies the possible use of stud bumps in connection with an arrangement as exemplified in FIG. 1 (QFN), bumps are likewise eligible for use in connection with an arrangement as exemplified in FIG. 2 (LGA/BGA).

FIGS. 4A to 4H are exemplary of various steps which may be implemented in a method for fabricating semiconductor products 100 as exemplified in FIGS. 1 to 3.

FIG. 4A is exemplary of a fabrication step for the provision of semiconductor dice 12 (simultaneous fabrication of plural devices is exemplified, as conventional in the art) each having electrically-conductive formations (pillars such as Cu pillars, for instance) 16 protruding upwardly at their front or upper side. The provision of leadframe material 10 (Cu sheet, for instance) is also exemplified. As conventional in the art, the leadframe material 10 may be provided with fiducials, not visible in the figure for simplicity.

FIG. 4B is exemplary of a fabrication step for the semiconductor dice 12 being attached onto the die pads 10b in the leadframe 10. This may be via die attach adhesive 12a (DAF or standard glue dispensing, for instance), which is not expressly indicated with a reference symbol in the subsequent figures for clarity of illustration.

FIG. 4C is exemplary of a fabrication step for LDS molding compound 14 being molded onto the structure resulting from the step of FIG. 4B. This may optionally include (compression) molding of resin film 16a intended to hold the pillars 16 formed onto the dice 12 to keep the distal ends thereof clear of the LDS molding compound, so that these distal ends of the pillars 16 will be left uncovered by the molding compound 14 and remain (clearly) visible by a camera such as C. As discussed, this may involve covering the die or dice 12 on the leadframe with a (very) thin resin layer (50 um, for instance) thus facilitating growing pillars 16 in such a way.

Figure 4D:
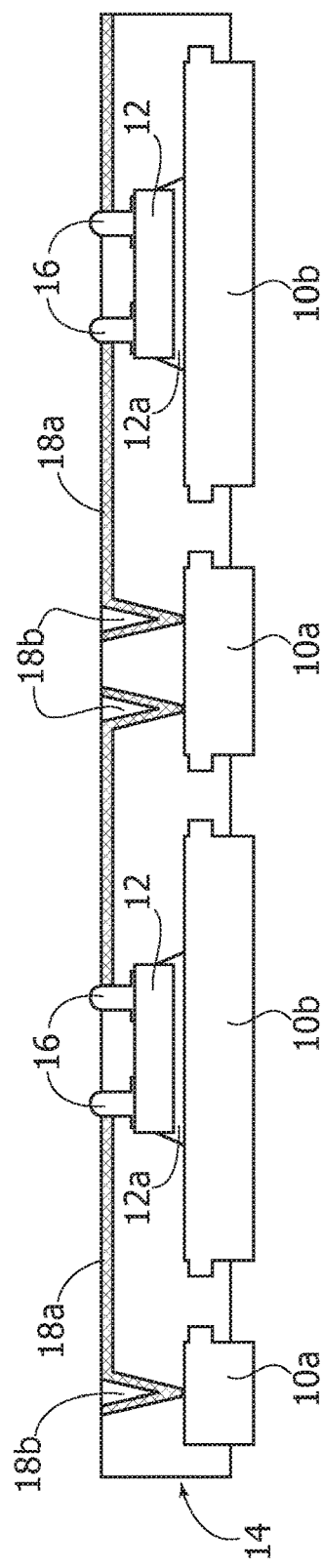
Figure 4E:
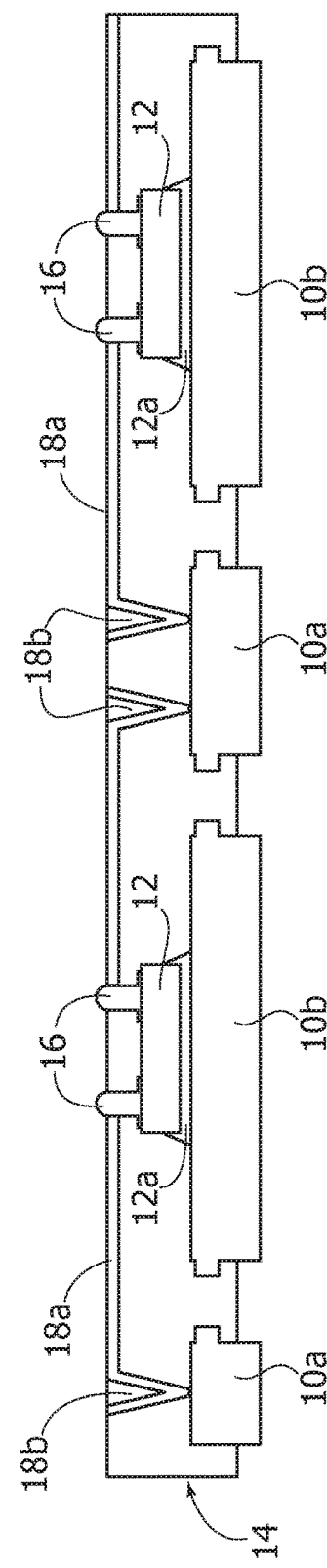

FIGS. 4D and 4E are exemplary of fabrication steps for the formation of lines (traces) 18a and/or vias 18b through camera-referenced laser machining (LDS processing). This may occur via a laser unit L as exemplified in FIGS. 1 to 3 with the associated camera C capable of locating the formations 16 surfacing at the upper or front surface of the layer 14 to guide the laser unit L. FIG. 4E is exemplary of a fabrication step for metallization (via electroplating, for instance, as conventional in the art of LDS processing) of the lines 18a and/or the vias 18b to increase their electrical conductivity.

Figure 4F:
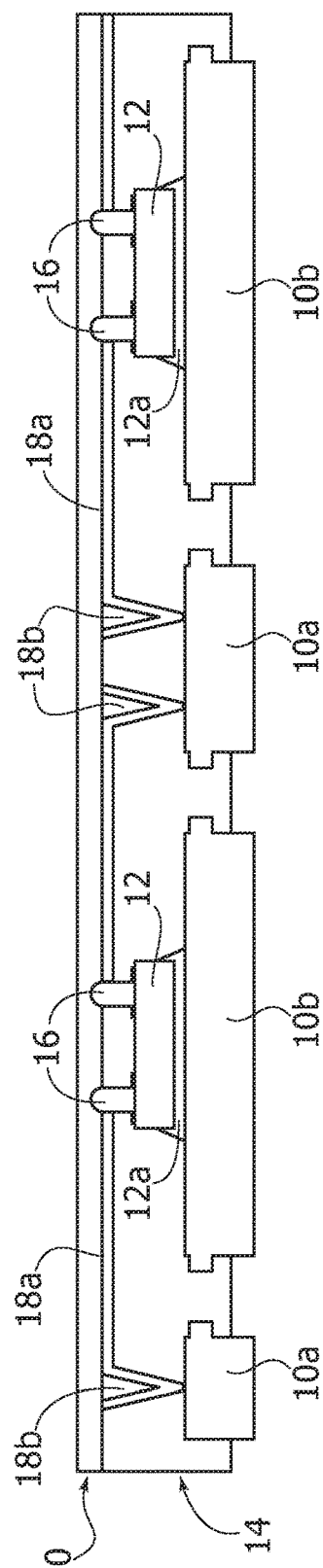

FIG. 4F is exemplary of a fabrication step for (further) package molding compound 20 being molded to complete the packaging of the product 100, with FIG. 4G exemplary of a fabrication step for possible metal plating (tin plating, for instance) 10c formed at the bottom (back) surface of the leadframe 10.

FIG. 4H is exemplary of a fabrication step for an act of singulation via a conventional singulation tool as exemplified at TS to form individual semiconductor devices 100.

FIG. 5 is exemplary (by way of direct comparison to the upper portion of FIG. 4A) of the possibility of providing the semiconductor dice 12 with stud bumps (in the place of pillars) as the electrically-conductive formations 16 protruding upwardly at their front or upper side. The steps of FIGS. 4A to 4H may be practically identically applied to such dice 12 equipped with bumps arranged onto a substrate 10 such as a leadframe.

A method as exemplified herein may comprise:
providing a substrate (for instance, a leadframe such as 10), arranging (for instance, at 12a) at least one semiconductor die (for instance, 12) on said substrate wherein the at least one semiconductor die is provided with at least one electrically-conductive protrusion (for instance, 16) protruding from the at least one semiconductor die opposite said substrate, molding laser direct structuring (LDS) material (for instance, 14) onto the substrate having the at least one semiconductor die arranged thereon with the at least one semiconductor die having said at least one electrically-conductive protrusion protruding therefrom opposite said substrate, wherein said molding leaves a distal end of said at least one electrically-conductive protrusion optically detectable at the surface of said laser direct structuring material, laser beam processing (for instance, L) the laser direct structuring material molded onto the substrate having at least one semiconductor die arranged thereon to provide electrically conductive formations (for instance, 18a, 18b) for the at least one semiconductor die (12) arranged on said substrate, wherein said laser beam processing comprises applying laser beam energy to the surface of said laser direct structuring material at spatial positions (for instance, at the formations 18a, 18b) located as a function of said distal end of said at least one electrically-conductive protrusion optically detectable at the surface of said laser direct structuring material.

As exemplified herein, laser beam processing of the laser direct structuring material (for instance, 14) can thus take place with laser beam energy applied at positions of the surface of the laser direct structuring material located by using as a spatial reference the electrically-conductive protrusions optically detectable at the surface of the laser direct structuring material.

In a method as exemplified herein, said at least one electrically-conductive protrusion protruding from the at least one semiconductor die opposite said substrate may comprise an electrically-conductive pillar or an electrically-conductive bump.

In a method as exemplified herein, said at least one electrically-conductive protrusion protruding from the at least one semiconductor die opposite said substrate may comprise an electroplated protrusion.

In a method as exemplified herein, said at least one electrically-conductive protrusion may comprise copper material.

A method as exemplified herein may comprise forming at the surface of said laser direct structuring material, optionally by compression molding film material onto said surface, a holding layer (for instance, 16a) to retain said distal end of said at least one electrically-conductive protrusion.

A method as exemplified herein may comprise directing laser beam energy towards said distal end of said at least one electrically-conductive protrusion optically detectable at the surface of said laser direct structuring material to provide electrical coupling thereof to said electrically conductive formations (for instance, 18a, 18b) for the at least one semiconductor die arranged on said substrate.

In a method as exemplified herein, said laser beam processing may comprise applying (by plating for instance) electrically-conductive material onto said locations of the surface of said laser direct structuring material having said laser beam energy applied thereto.

A method as exemplified herein may comprise providing a plurality of said electrically-conductive protrusions (for instance, 16) protruding from the at least one semiconductor die opposite said substrate.

A semiconductor device (for instance, 100) as exemplified herein may comprise:

an assembly of a substrate (for instance, 10), at least one semiconductor die (for instance, 12) arranged on said substrate as well as laser direct structuring material (for instance, 14) molded thereon with electrically conductive formations (for instance, 18a, 18b) for the at least one semiconductor die arranged on said substrate provided with a method as exemplified herein, and package molding material (for instance, 20) molded onto said assembly opposite said substrate to provide encapsulation thereof.

Without prejudice to the underlying principles, the details and the embodiments may vary, even significantly, with respect to what has been described by way of example only without departing from the scope of the embodiments.

The claims are an integral part of the disclosure of embodiments as provided herein.

The extent of protection is determined by the annexed claims.

The invention claimed is:
1. A method, comprising:
arranging at least one semiconductor die on a substrate wherein the at least one semiconductor die is provided with at least one electrically-conductive protrusion protruding from the at least one semiconductor die opposite said substrate;
molding a laser direct structuring material onto the substrate having the at least one semiconductor die arranged thereon with the at least one semiconductor die having said at least one electrically-conductive protrusion protruding therefrom opposite said substrate, wherein said molding leaves a distal end of said at least one electrically-conductive protrusion optically detectable at a surface of the laser direct structuring material; and
laser beam processing the laser direct structuring material molded onto the substrate having at least one semiconductor die arranged thereon to provide electrically conductive formations for the at least one semiconductor die arranged on said substrate, wherein said laser beam processing comprises:
optically detecting said distal end of said at least one electrically-conductive protrusion; and
applying laser beam energy to the surface of said laser direct structuring material at spatial positions located as a function of the optically detected distal end of said at least one electrically-conductive protrusion in order to produce said electrically conductive formations at said spatial positions;
wherein applying laser beam energy comprises displacing and operating a laser guided by the optically detected distal end of said at least one electrically-conductive protrusion to produce the electrically conductive formations.

2. The method of claim 1, wherein said at least one electrically-conductive protrusion protruding from the at least one semiconductor die opposite said substrate comprises an electrically-conductive pillar.

3. The method of claim 1, wherein said at least one electrically-conductive protrusion protruding from the at least one semiconductor die opposite said substrate comprises an electrically-conductive bump.

4. The method of claim 1, wherein said at least one electrically-conductive protrusion protruding from the at least one semiconductor die opposite said substrate comprises an electroplated protrusion.

5. The method of claim 1, wherein said at least one electrically-conductive protrusion comprises copper material.

6. The method of claim 1, wherein molding further comprises forming a holding layer to retain said distal end of said at least one electrically-conductive protrusion.

7. The method of claim 1, further comprising directing laser beam energy towards said distal end of said at least one electrically-conductive protrusion to provide electrical coupling thereof to said electrically conductive formations for the at least one semiconductor die arranged on said substrate.

8. The method of claim 1, wherein said laser beam processing comprises applying electrically-conductive material onto said spatial positions where said laser beam energy is applied.

9. The method of claim 1, further comprising providing a plurality of said electrically-conductive protrusions protruding from the at least one semiconductor die opposite said substrate.

10. The method of claim 1, wherein the substrate is a leadframe.

11. A method, comprising:
arranging at least one semiconductor die on a substrate wherein the at least one semiconductor die is provided with at least one electrically-conductive protrusion protruding from the at least one semiconductor die opposite said substrate;
molding a laser direct structuring material onto the substrate having the at least one semiconductor die arranged thereon with the at least one semiconductor die having said at least one electrically-conductive protrusion protruding therefrom opposite said substrate, wherein said molding leaves a distal end of said at least one electrically-conductive protrusion optically detectable at a surface of the laser direct structuring material; and
laser beam processing the laser direct structuring material molded onto the substrate having at least one semiconductor die arranged thereon to provide electrically conductive formations for the at least one semiconductor die arranged on said substrate, wherein said laser beam processing comprises:
optically detecting said distal end of said at least one electrically-conductive protrusion; and
applying laser beam energy to the surface of said laser direct structuring material at spatial positions located as a function of the optically detected distal end of said at least one electrically-conductive protrusion in order to produce said electrically conductive formations at said spatial positions;
wherein molding further comprises forming a holding layer to retain said distal end of said at least one electrically-conductive protrusion; and
wherein forming the holding layer comprises applying compression molding film material onto said distal end.

12. The method of claim 11, wherein said at least one electrically-conductive protrusion protruding from the at least one semiconductor die opposite said substrate comprises a structure selected from a group consisting of: an electrically-conductive pillar, an electrically-conductive bump, and an electroplated protrusion.

13. The method of claim 11, wherein the substrate is a leadframe.

14. A method, comprising:
forming an electrically-conductive protrusion extending from a top surface of a semiconductor die;
mounting a bottom surface of the semiconductor die on a leadframe;
molding a laser direct structuring material onto the leadframe to encapsulate the semiconductor and a portion of the electrically-conductive protrusion such that a distal end of said electrically-conductive protrusion extends above a top surface of the molded laser direct structuring material;
optically detecting said distal end of said electrically-conductive protrusion; and
laser beam processing the laser direct structuring material at spatial positions located as a function of the optically detected distal end of said electrically-conductive protrusion in order to produce electrically conductive formations at said spatial positions;
wherein laser beam processing comprises displacing and operating a laser guided by the optically detected distal end of said electrically-conductive protrusion to produce the electrically conductive formations.

15. The method of claim 14, wherein forming the electrically-conductive protrusion comprises producing the electrically-conductive protrusion as an electrically-conductive pillar.

16. The method of claim 14, wherein forming the electrically-conductive protrusion comprises producing the electrically-conductive protrusion as an electrically-conductive bump.

17. The method of claim 14, wherein forming the electrically-conductive protrusion comprises producing the electrically-conductive protrusion as an electroplated protrusion.

18. The method of claim 14, wherein said electrically-conductive protrusion is made of copper.

19. The method of claim 14, wherein molding comprises forming a holding layer configured to retain said distal end of said electrically-conductive protrusion.

20. The method of claim 14, further comprising directing laser beam energy towards said distal end of said electrically-conductive protrusion to provide electrical coupling of the electrically-conductive protrusion to said electrically conductive formations.

21. The method of claim 14, further comprising directing laser beam energy towards said spatial positions and applying electrically-conductive material onto said spatial positions where said laser beam energy is directed.

22. A method, comprising:
forming an electrically-conductive protrusion extending from a top surface of a semiconductor die;
mounting a bottom surface of the semiconductor die on a leadframe;
molding a laser direct structuring material onto the leadframe to encapsulate the semiconductor and a portion of the electrically-conductive protrusion such that a distal end of said electrically-conductive protrusion extends above a top surface of the molded laser direct structuring material;
optically detecting said distal end of said electrically-conductive protrusion; and
laser beam processing the laser direct structuring material at spatial positions located as a function of the optically detected distal end of said electrically-conductive protrusion in order to produce electrically conductive formations at said spatial positions;
wherein molding comprises forming a holding layer configured to retain said distal end of said electrically-conductive protrusion; and
wherein the holding layer is a compression molding film.

23. The method of claim 22, wherein said at least one electrically-conductive protrusion protruding from the at least one semiconductor die opposite said substrate comprises a structure selected from a group consisting of: an electrically-conductive pillar, an electrically-conductive bump, and an electroplated protrusion.

\* \* \* \* \*